(12) United States Patent
Dutta (10) Patent No.: US 10,977,876 B2
(45) Date of Patent: Apr. 13, 2021

(54) SYSTEM AND METHOD FOR MODIFYING VEHICLE DESIGN BASED ON SENSORS

(71) Applicant: Toyota Motor North America, Inc., Plano, TX (US)

(72) Inventor: Neil Dutta, Addison, TX (US)

(73) Assignee: TOYOTA MOTOR NORTH AMERICA, INC., Plano, TX (US)

( * ) Notice: Subject to any disclaimer, the term of this patent is extended or adjusted under 35 U.S.C. 154(b) by 24 days.

(21) Appl. No.: 16/224,366

(22) Filed: Dec. 18, 2018

(65) Prior Publication Data

US 2020/0193728 A1 Jun. 18, 2020

(51) Int. Cl.
*G07C 5/00* (2006.01)
*G07C 5/08* (2006.01)
*G06F 30/15* (2020.01)

(52) U.S. Cl.
CPC ............. *G07C 5/008* (2013.01); *G06F 30/15* (2020.01); *G07C 5/085* (2013.01); *G07C 5/0808* (2013.01)

(58) Field of Classification Search
CPC ...... G07C 5/008; G07C 5/0808; G07C 5/085; G06F 30/15; G06F 16/2465; G06F 30/23; B60T 8/172
See application file for complete search history.

(56) References Cited

U.S. PATENT DOCUMENTS

| | | | |
|---|---|---|---|
| 5,742,141 A | * | 4/1998 | Czekaj .................. B62D 15/028 180/167 |
| 6,092,060 A | | 7/2000 | Guinta et al. |
| 6,879,893 B2 | | 4/2005 | Woodard et al. |
| 6,907,416 B2 | | 6/2005 | Tasooji et al. |
| 7,243,945 B2 | | 7/2007 | Breed et al. |
| 7,715,961 B1 | | 5/2010 | Kargupta |
| 8,374,745 B2 | | 2/2013 | Zhang et al. |
| 8,775,010 B2 | | 7/2014 | Sohmshetty et al. |

(Continued)

FOREIGN PATENT DOCUMENTS

CN 105808890 7/2016

OTHER PUBLICATIONS

Zhang et al.; "*Connected Vehicle Diagnostics and Prognostics, Concept, and Initial Practice*"; IEEE Transactions on Relability; vol. 58, No. 2; pp. 286-294; Jun. 2009.

(Continued)

*Primary Examiner* — Anne Marie Antonucci
*Assistant Examiner* — Andrew J Cromer
(74) *Attorney, Agent, or Firm* — Snell & Wilmer LLP (57) ABSTRACT

Methods and systems for improving vehicle design. The system includes a plurality of first version vehicles, each first version vehicle of the plurality of first version vehicles having a first version vehicle design, and including one or more sensors for detecting sensor data, and a vehicle transceiver configured to communicate the sensor data. The system also includes a remote data server configured to receive the sensor data from the plurality of first version vehicles and determine one or more improvements to the first version vehicle design based on the received sensor data. The system also includes a computing device coupled to the remote data server and configured to execute vehicle design software for designing a second version vehicle design, the second version vehicle design including the one or more improvements to the first version vehicle design.

20 Claims, 6 Drawing Sheets

(56) References Cited

U.S. PATENT DOCUMENTS

| | | |
|---|---|---|
| 8,954,225 B2 | 2/2015 | LaForge et al. |
| 8,959,007 B2 | 2/2015 | Khella |
| 9,079,505 B1 | 7/2015 | Hyde et al. |
| 9,454,855 B2 | 9/2016 | Ahn et al. |
| 2005/0022152 A1* | 1/2005 | Turk ................... G06F 30/23 717/100 |
| 2010/0235149 A1* | 9/2010 | Allen ................... G06F 30/23 703/2 |
| 2012/0296514 A1* | 11/2012 | Sohmshetty ........ G06F 16/2465 701/30.2 |

OTHER PUBLICATIONS

Pearre et al.; "*Electric vehicles: How much range is required for a day's driving?*"; Transportation Research Part C; 14 pages; 2011.
Abbott et al.; "*Autonomous Trucking: The Interplay Between Design and Business Constraints*"; IEEE; 5 pages; 2017.

\* cited by examiner

SYSTEM AND METHOD FOR MODIFYING VEHICLE DESIGN BASED ON SENSORS

BACKGROUND

1. Field

This specification relates to a system and a method for improving vehicle design based on sensor data from existing designs.

2. Description of the Related Art

Vehicles, such as automobiles, may have periodic vehicle redesigns. For example, an automobile of Make W and Model Q may have a first design in 2001, a minor redesign in 2002, a further minor redesign in 2003, another minor redesign in 2004, and a major redesign in 2005. With each minor or major redesign, various aspects of the vehicle body and structure may be adjusted for functional or aesthetic purposes. While the redesigns may improve the vehicle, there may be other improvements to the vehicle that may be made that the vehicle designer(s) are not aware of. Thus, there is a need for improved vehicle design systems and methods.

SUMMARY

What is described is a system for improving a vehicle design. The system includes a plurality of first version vehicles, each first version vehicle of the plurality of first version vehicles having a first version vehicle design, and including one or more sensors for detecting sensor data, and a vehicle transceiver configured to communicate the sensor data. The system also includes a remote data server configured to receive the sensor data from the plurality of first version vehicles and determine one or more improvements to the first version vehicle design based on the received sensor data. The system also includes a computing device coupled to the remote data server and configured to execute vehicle design software for designing a second version vehicle design, the second version vehicle design including the one or more improvements to the first version vehicle design.

Also described is a system for improving a vehicle design. The system includes a plurality of first version vehicles, each first version vehicle of the plurality of first version vehicles having a first version vehicle design, and including one or more sensors for detecting sensor data, and a vehicle transceiver configured to communicate the sensor data. The system also includes a computing device configured to receive the sensor data, determine one or more improvements to the first version vehicle design based on the received sensor data, and execute vehicle design software for designing a second version vehicle design, the second version vehicle design including the one or more improvements to the first version vehicle design.

Also described is a method for improving a vehicle design. The method includes detecting, by one or more sensors of a vehicle, sensor data associated with operations of the vehicle. The method also includes communicating, by a vehicle transceiver of the vehicle to a remote data server, the sensor data. The method also includes receiving, by the remote data server, respective sensor data from a plurality of vehicles each having a substantially similar design. The method also includes analyzing the respective sensor data from the plurality of vehicles to determine one or more improvements to the design of the plurality of vehicles. The method also includes designing, by a computing device, a subsequent vehicle design using vehicle design software, the subsequent vehicle design including the one or more improvements to the design of the plurality of vehicles.

BRIEF DESCRIPTION OF THE DRAWINGS

Other systems, methods, features, and advantages of the present invention will be apparent to one skilled in the art upon examination of the following figures and detailed description. Component parts shown in the drawings are not necessarily to scale, and may be exaggerated to better illustrate the important features of the present invention.

DETAILED DESCRIPTION

Disclosed herein are systems, vehicles, and methods for improving the design of a vehicle. Conventionally, vehicles are designed using sophisticated computer software that is specially configured for designing vehicles. Those designing the vehicle may take vehicle aesthetics, vehicle functionality, and vehicle cost into consideration when designing the vehicle. Balancing these considerations is a challenging task and relies on the experience of the vehicle designers.

The systems and methods described herein detect data from various sensors of a vehicle and uses the data from multiple vehicles of the same make, model, and design to determine improvements that may be made to the vehicle design that may be incorporated into a future design of the vehicle. By basing the design improvements using collected data, the design improvements may be made on a more quantitative and data-driven basis.

The systems and methods described herein are an improvement to the technology of designing vehicles using computer design software. The systems and methods described herein require the use of computer technology to improve the designs of future vehicles in a timely manner. If a human being were to manually process the amount of data detected from the sensors of the vehicles, the human being would not be able to respond to the time demands of a yearly design cycle. The systems and methods described herein use sensors to transform the detected vehicle data into an improved vehicle design. In some embodiments, the vehicle design is automatically updated, and the vehicle is automatically created based on the updated design.

Figure 1A:
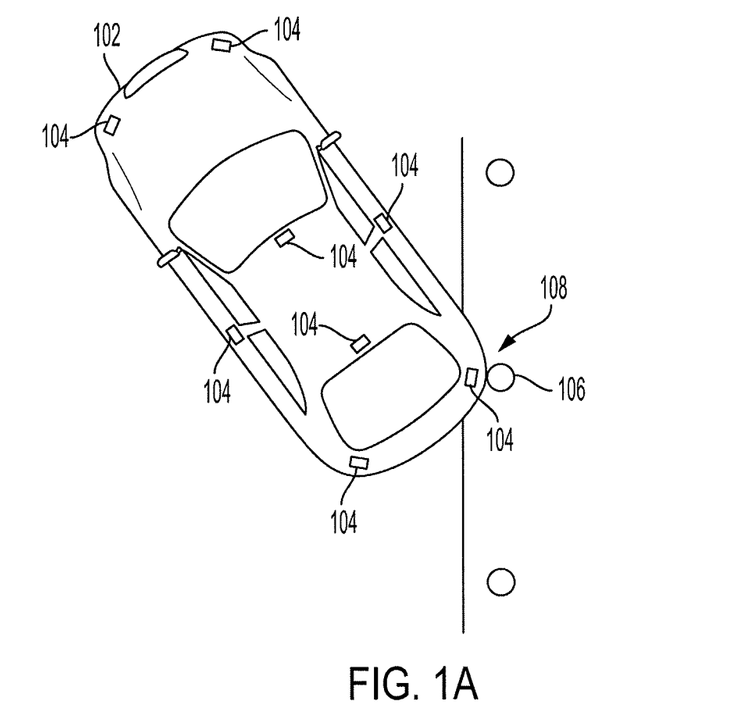
FIG. 1A illustrates a vehicle having a first vehicle design detecting a collision with a pole, according to various embodiments of the invention.

FIG. 1A illustrates an overhead view of a first version vehicle 102 colliding with a pole 106. The first version vehicle 102 includes multiple sensors 104. The sensors 104 may include spatial sensors configured to detect spatial data of the environment around the first version vehicle 102. The sensors 104 may also include image sensors configured to detect image data of the environment around the first version vehicle 102. The sensors 104 may also include vibration sensors configured to detect when contact has been made with an object, such as a pole 106. The sensors 104 may also include an engine sensor, a motor/generator sensor, a transmission sensor, a steering wheel sensor, one or more weight sensors, an accelerator pedal sensor, and/or a brake pedal sensor.

When contact is made with an object, such as the pole 106, the sensor data detected by the sensors 104 is recorded and stored by the first version vehicle 102. The sensor data may include image data, spatial data, and/or vibration data detected by the sensors 104. The sensor data may be used to determine a location 108 on the first version vehicle 102 where contact was made with the object. The location 108 may be accurate to a square inch of the first version vehicle 102. The location 108 may be determined by combining data from the various sensors 104. For example, a vibration sensor and an image sensor may be used in combination to determine the location 108 by combining an intensity of contact and relative distance from the image sensor.

The state of the first version vehicle 102 may also be detected using sensor data to determine a context for the collision. For example, the engine sensor may indicate that the vehicle was operating normally, the transmission sensor may indicate that the vehicle was in reverse, the steering wheel sensor may indicate sporadic movement by the driver prior to the collision, the accelerator pedal sensor may track engagement of the accelerator pedal by the driver prior to the collision, and the brake pedal sensor may track engagement of the brake pedal by the driver prior to the collision.

Figure 1B:
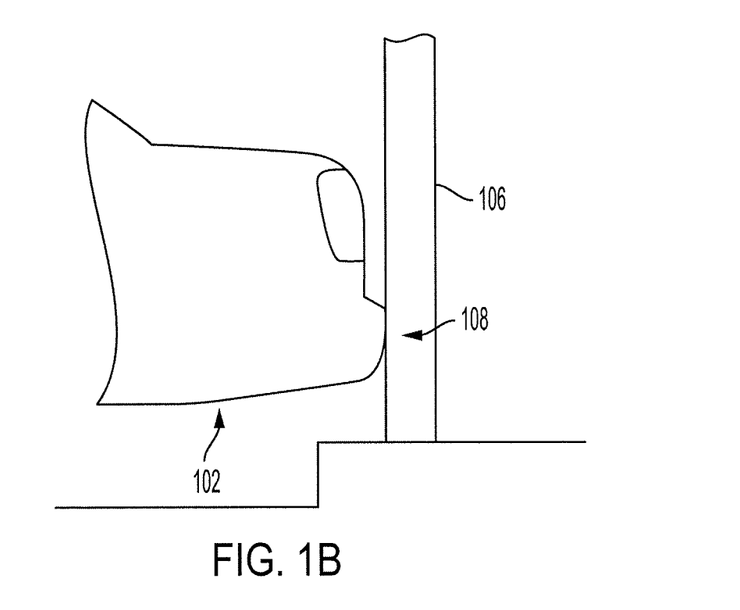
FIG. 1B illustrates the vehicle of FIG. 1A making contact with the pole, according to various embodiments of the invention.

FIG. 1B illustrates a side view of the first version vehicle 102 colliding with the pole 106. The location 108 where contact was made with the pole 106 is also illustrated. In the illustrated example, the location 108 is on the rear bumper of the first version vehicle 102, but in other situations, the location 108 may be on the side of the first version vehicle 102, the front of the first version vehicle 102, or any other location.

Once the location 108 of the collision is determined and once the sensor data associated with the state of the vehicle (e.g., engine sensor data, transmission sensor data, steering wheel sensor data, accelerator pedal sensor data, brake pedal sensor data) is detected, the location 108 of the collision and the sensor data associated with the state of the vehicle may be stored in a memory (e.g., the cloud). The memory may be local to the first version vehicle 102 or may be remote.

The sensor data from multiple vehicles may be communicated to a remote computing device. The remote computing device may analyze the sensor data from the multiple vehicles, and the remote computing device may determine trends based on the sensor data. The trends may indicate areas of the vehicle that may be improved on future versions. For example, when a particular location, such as location 108 of the vehicle is frequently contacted when the driver performs a parallel parking maneuver, the profile of the location 108 on future versions of the vehicle may be improved to reduce the frequency of contacts when the driver performs a parallel parking maneuver.

Figure 1C:
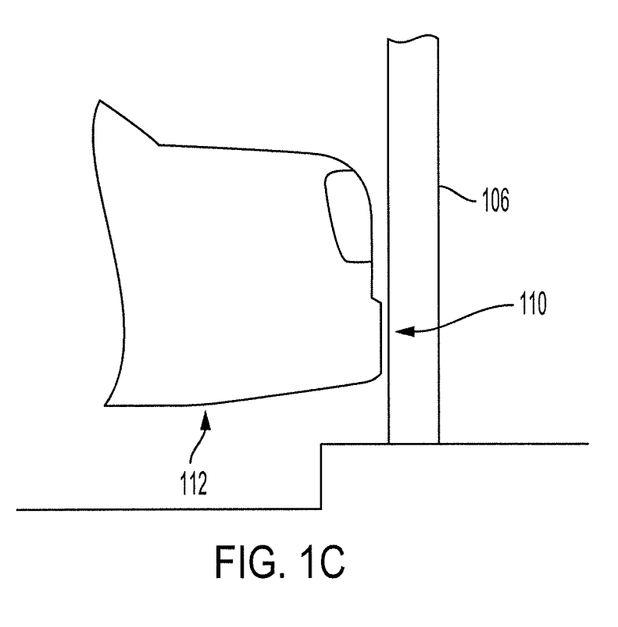
FIG. 1C illustrates a vehicle having a second vehicle design avoiding a collision with the pole, according to various embodiments of the invention.

FIG. 1C illustrates a side view of a second version vehicle 112 in a similar situation as the first version vehicle 102 as illustrated in FIG. 1B. The second version vehicle 112 has an improved profile at a location 110 corresponding to the location 108 of the first version vehicle 102. Because of the improved profile at the location 110, the second version vehicle 112 does not make contact with the pole 106.

Figure 2:
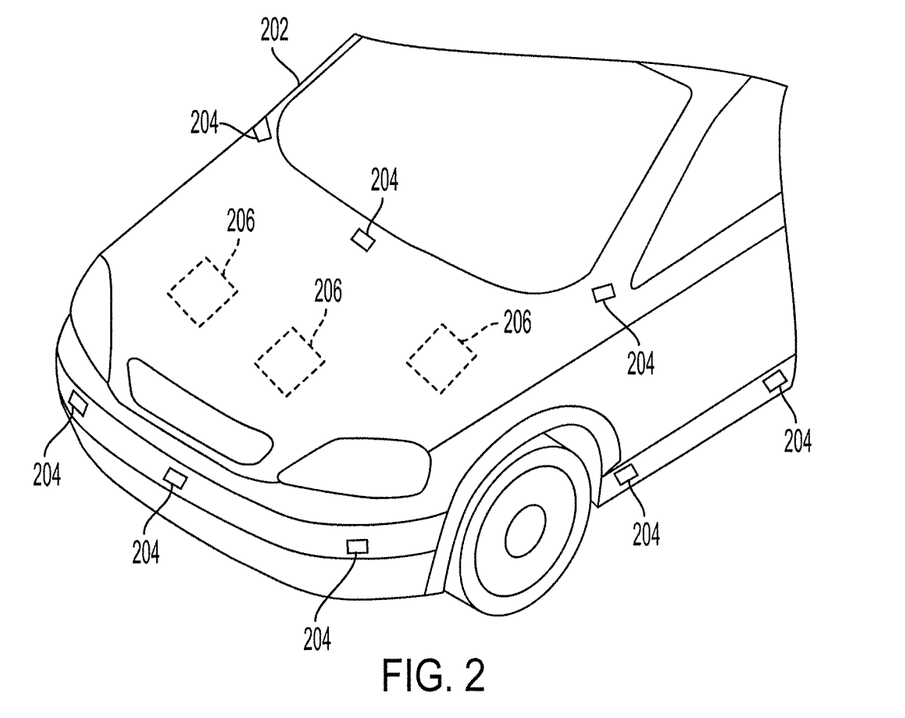
FIG. 2 illustrates a vehicle with various sensors, according to various embodiments of the invention.

FIG. 2 illustrates a plurality of sensors located on a vehicle 202, according to various embodiments of the invention. The sensors may include a plurality of exterior sensors 204 and a plurality of interior sensors 206.

The exterior sensors 204 may include spatial sensors configured to detect spatial data of the environment around the vehicle 202. The exterior sensors 204 may also include image sensors configured to detect image data of the environment around the vehicle 202. The exterior sensors 204 may include vibration sensors configured to detect when contact has been made with an object. The vibration sensors may also be configured to detect a distance from the vibration sensor where contact was made with the object.

The exterior sensors 204 may be located on an exterior surface of the vehicle 202. The exterior sensors 204 may be spaced apart from each other in such a manner that substantially all regions of the vehicle 202 are covered by at least one exterior sensor 204. The data from the exterior sensors 204 may be used to determine whether contact has been made with an object and the location of where contact was made with the object. For example, detected image data may be analyzed to identify a type of object that the vehicle 202 made contact with, as well as any object attributes, such as object height, object width, object shape, or object color. For example, the image data may be used to determine that the vehicle 202 performs more adjustments than normal when parallel parking near a green curb or near objects on the curb that are less than 2 feet tall. The normal number of adjustments made in a parallel parking maneuver may also be detected from sensor data from a plurality of vehicles.

The interior sensors 206 may include an engine sensor configured to detect engine data, such as engine speed or speed of the vehicle. The interior sensors 206 may also include a motor/generator sensor configured to detect motor/generator data, such as rate of electricity use. The interior sensors 206 may also include a transmission sensor configured to detect a transmission state (e.g., park, drive, reverse, neutral) at any given time. The interior sensors 206 may also include a steering wheel sensor configured to detect steering wheel data including a steering wheel position over time, a rate of turning over time, and a direction of turning. The interior sensors 206 may also include an accelerator pedal sensor configured to detect accelerator pedal data including an accelerator pedal position over time and a rate of engagement of the accelerator pedal over time. The interior sensors 206 may also include a brake pedal sensor configured to detect brake pedal data including a brake pedal position over time and a rate of engagement of the brake pedal over time. The interior sensors 206 may also include a weight sensor configured to detect weight data of the vehicle. The weight data may be used to determine whether the vehicle has even weight distribution when used in the real world.

In some embodiments, the data from the interior sensors 206 is used to determine a state of the vehicle 202 when a collision is detected by the external sensors 204. For example, when the vehicle 202 makes contact with an object, and the transmission sensor indicates the vehicle is in drive, the engine sensor indicates the vehicle is travelling at 45 miles per hour, and the steering wheel sensor indicates that the vehicle was slowly turned at a 10 degree angle to the right prior to the detected collision, it may be determined that the vehicle 202 was executing a lane change maneuver when the collision occurred. When a statistically significant number of collisions are detected by multiple vehicles at a similar location when the respective vehicles are making a lane change maneuver, this may indicate that improvements to sight lines may be made.

In some embodiments, the data from the interior sensors 206 is used to determine improvements to subsequent vehicles. For example, the steering wheel data may be analyzed to determine whether the steering wheel may be improved. In some embodiments, abruptness of turning the steering wheel (shown by the rate of turning of the steering wheel over time) may indicate that the steering wheel tightness may be improved or optimized. The rate of turning of the steering wheel over time for many vehicles may be analyzed, and when there is a statistically significant number of abrupt turning events, the system may determine that the steering wheel tightness may be improved or optimized. In another example, the weight data from the one or more weight sensors may be analyzed to determine whether relatively even weight distribution is maintained when the vehicle is used in the real world. For example, the weight data may indicate that a majority of vehicle users place large amounts of heavy objects on one side of the trunk. An improvement may be made in a subsequent version of the vehicle to distribute weight of the vehicle in anticipation of this use of the trunk. The weight data may also include downward forces experienced by the vehicle from structural elements of the vehicle, such as spoilers. An improvement may be made in a subsequent version of the vehicle to increase or decrease the profile of these structural elements.

Any of the sensors described herein may be used by conventional vehicles for other conventional purposes. For example, conventionally, image sensors and spatial sensors are used to provide feedback to the driver when parking or for providing feedback to the driver regarding maintaining position in a driving lane or for providing feedback to the driver regarding the presence of another vehicle or object in a blind spot of the vehicle. However, in the systems and methods described herein, these conventional components are used in unconventional ways, in order to determine improved designs for subsequent vehicle versions.

Figure 3A:
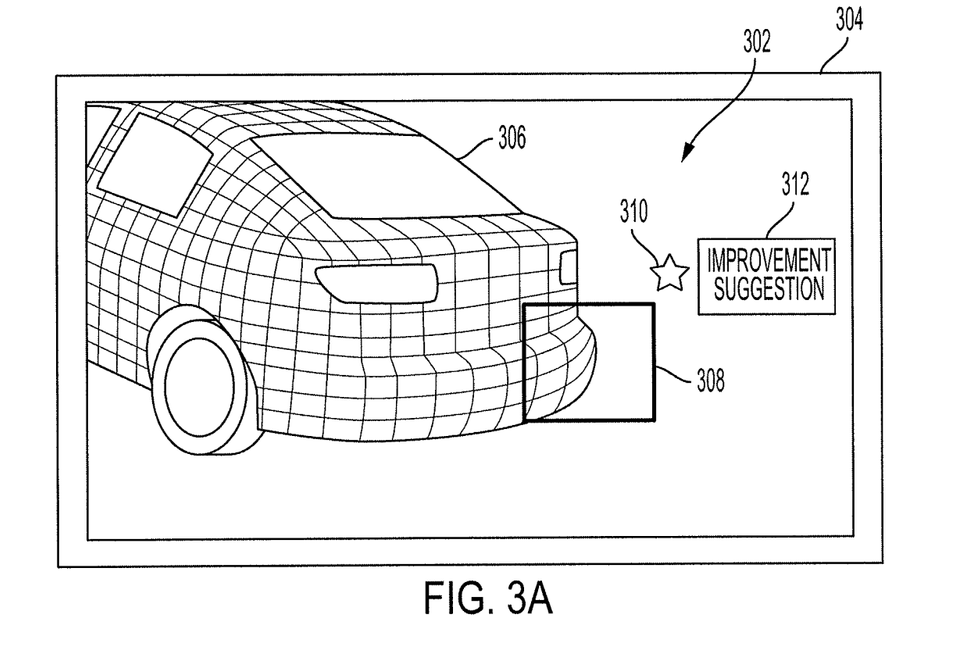
FIGS. 3A-3B illustrate a display screen and a graphical user interface for designing a second vehicle design based on sensor data, according to various embodiments of the invention.
Figure 3B:
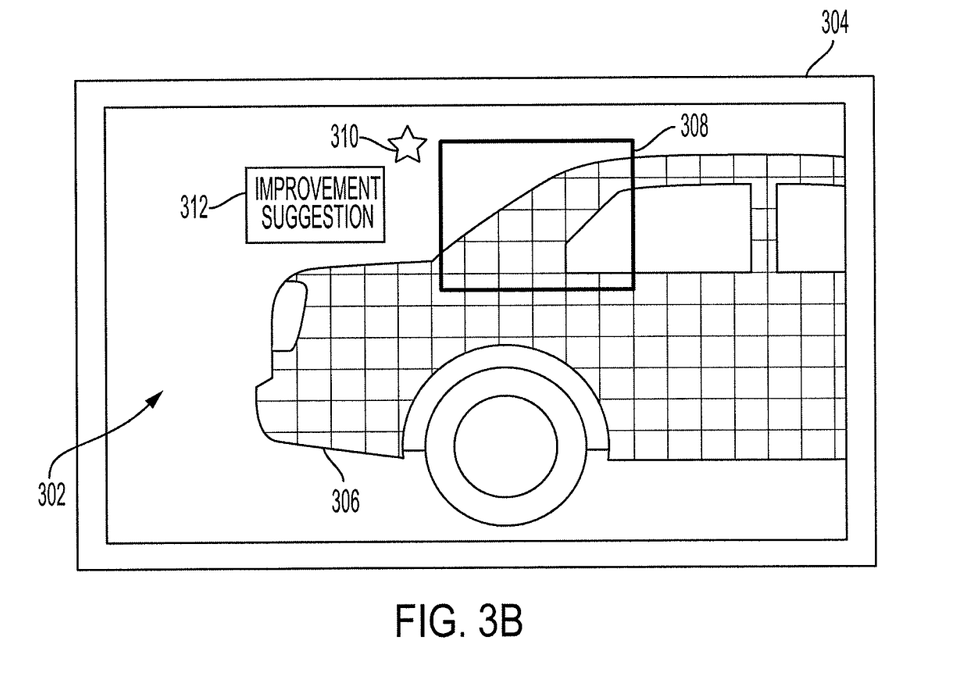

FIGS. 3A and 3B illustrate a user interface 302 displayed by a display screen 304 for designing a vehicle 306. The user interface 302 may be generated by computer software executed by a computing device that is specially programmed and specially constructed to facilitate computer-aided vehicle design.

The computing device may automatically analyze the sensor data from multiple first version vehicles to determine improvements that may be made to the design of the second version of the vehicle. For example, a plurality of first version vehicles may detect sensor data as described herein. The plurality of first version vehicles may communicate the sensor data to the computing device. The computing device may analyze the sensor data from the plurality of first version vehicles to determine one or more improvements that may be made to the second version of the vehicle.

The computing device may use one or more algorithms to determine whether an improvement should be suggested. For example, the computing device may determine a frequency of collision at a particular vehicle location, and when the frequency of collision exceeds a threshold frequency, the computing device may determine that an improvement may be made to the vehicle at the particular vehicle location. The computing device may then identify the vehicle state based on sensor data to determine a maneuver being performed by the vehicle (e.g., changing lanes, parking, parallel parking) when a collision occurred at the particular vehicle location. The computing device may determine whether the frequency of a particular maneuver exceeds a threshold frequency. When a particular maneuver exceeds a threshold frequency, the sensor data may be analyzed to determine a type of improvement to make. For example, it may be determined that 80% of the time that a particular location on the vehicle bumper makes contact with a non-moving object, the vehicle is parallel parking, so an improvement to the vehicle bumper may be made.

Conventionally, the vehicle designer may not have taken data of this granularity into consideration when designing the vehicle. The vehicle designer may have performed computer simulations on the vehicle 306 being designed, but the computer simulations may not have taken various real-world factors into account. In this way, the systems and methods described herein are an improvement to existing computer-based vehicle design technology. The systems and methods described herein improve the previously manually performed task of designing a vehicle by automating the identification of improvements to be made to the vehicle. The automatic identification of improvements is a process that has not been conventionally performed by vehicle designers. The safety, efficiency, and accuracy of vehicle design improvements may be improved by the systems and methods described herein.

The computing device may automatically display an alert on the user interface 302 to indicate to the human designer of the vehicle 306 of an improvement that may be made. The alert may include a box 308 or other shape identifying an area to be improved. The alert may also include an icon 310 to attract the attention of the designer. The alert may also include a text box 312 explaining the improvement. The text box 312 may include an identification of the area to be improved (e.g., "IMPROVE SIGHTLINES OUT OF THIS WINDOW"). The text box 312 may include information based on the sensor data (e.g., "75% OF DRIVERS WHO DING A WALL OR POLE MAKE CONTACT HERE"). The text box 312 may include specific information on how to improve the vehicle 306 (e.g., "MOVE THE LOCATION OF THE EXHAUST PIPE TO THE CENTER BY FIVE INCHES").

The alert may also be used to indicate whether a newly-added design feature is likely to cause problems based on the sensor data. For example, if the proposed new design of the vehicle 306 were to reduce the size of the windows as compared to a previous version, and the sensor data indicates that the vehicle drivers may not be able to see out of the smaller windows, the computing device may generate an alert to display. The alert may include a text box with general guidelines based on the sensor data (e.g., "DRIVERS MAY NOT HAVE SUFFICIENT SIGHTLINES OUT OF THIS WINDOW").

In some embodiments, instead of alerting the vehicle designer to improvements which may be made, the computing device automatically determines changes to make to the vehicle 306 to improve one or more aspects of the vehicle 306 based on the sensor data, and the computing device automatically designs the vehicle 306 to incorporate the determined changes.

Figure 4:
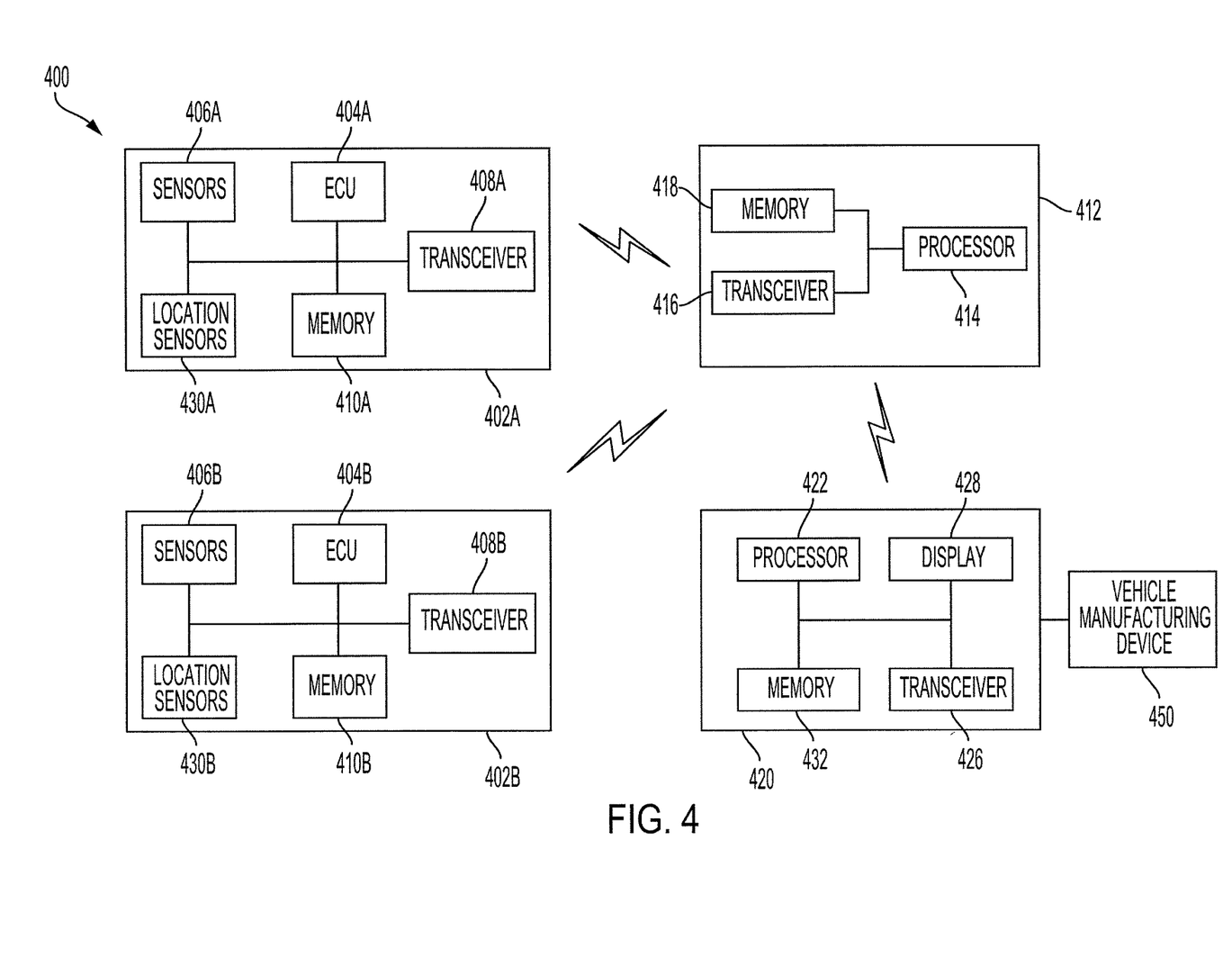
FIG. 4 illustrates a system for improving vehicle design, according to various embodiments of the invention.

FIG. 4 illustrates a block diagram of the system 400. The system 400 includes a first vehicle 402A and a second vehicle 402B. Components having a letter suffix may be referred to collectively or individually by the number before the letter suffix. For example, vehicle 402 may refer to the first vehicle 402A and the second vehicle 402B collectively or may refer to either the first vehicle 402A or the second vehicle 402B individually. The vehicles 402 may be similar to any of the vehicles described herein, such as vehicle 102, vehicle 112, or vehicle 202.

The vehicle 402 may have an automatic or manual transmission. The vehicle 402 is a conveyance capable of transporting a person, an object, or a permanently or temporarily affixed apparatus. The vehicle 402 may be a self-propelled wheeled conveyance, such as a car, a sports utility vehicle, a truck, a bus, a van or other motor or battery driven vehicle. For example, the vehicle 402 may be an electric vehicle, a hybrid vehicle, a plug-in hybrid vehicle, a fuel cell vehicle, or any other type of vehicle that includes a motor/generator. Other examples of vehicles include bicycles, trains, planes, or boats, and any other form of conveyance that is capable of transportation. The vehicle 402 may be semi-autonomous vehicle or an autonomous vehicle. That is, the vehicle 402 may be self-maneuvering and navigate without human input. An autonomous vehicle may use one or more sensors and/or a navigation unit to drive autonomously.

The vehicle 402 (e.g., first vehicle 402A and second vehicle 402B) may have a first version vehicle design. The vehicle 402 includes an ECU 404 (e.g., ECU 404A and 404B) connected to a transceiver 408 (e.g., 408A and 408B), a location sensor 430 (e.g., 430A and 430B), a memory 410 (e.g., 410A and 410B), and sensors 406 (e.g., 406A and 406B). The ECU 404 may be one or more ECUs, appropriately programmed, to control one or more operations of the vehicle. The one or more ECUs 404 may be implemented as a single ECU or in multiple ECUs. The ECU 404 may be electrically coupled to some or all of the components of the vehicle. In some embodiments, the ECU 404 is a central ECU configured to control one or more operations of the entire vehicle. In some embodiments, the ECU 404 is multiple ECUs located within the vehicle and each configured to control one or more local operations of the vehicle. In some embodiments, the ECU 404 is one or more computer processors or controllers configured to execute instructions stored in a non-transitory memory 410. All of the elements of the vehicle 402 may be connected via a communications bus.

The sensors 406 may include spatial sensors configured to detect spatial data of the environment around the vehicle 402, image sensors configured to detect image data of the environment around the vehicle 402, vibration sensors configured to detect when contact has been made with an object, an engine sensor, a motor/generator sensor, a transmission sensor, a steering wheel sensor, one or more weight sensors, an accelerator pedal sensor, and/or a brake pedal sensor.

The vehicle 402 may be coupled to a network. The network, such as a local area network (LAN), a wide area network (WAN), a cellular network, a digital short-range communication (DSRC), LORA (Long Range), the Internet, or any other type of interconnectivity or combinations thereof, connects the vehicle 402 to a remote data server 412.

The transceiver 408 may include a communication port or channel, such as one or more of a Wi-Fi unit, a Bluetooth® unit, a Radio Frequency Identification (RFID) tag or reader, a DSRC unit, a LORA unit, or a cellular network unit for accessing a cellular network (such as 3G, 4G, or 5G) or any other wireless technology. The transceiver 408 may transmit data to and receive data from devices and systems not physically connected to the vehicle. For example, the ECU 404 may communicate with the remote data server 412. Furthermore, the transceiver 408 may access the network, to which the remote data server 412 is also connected.

The location sensor 430 is connected to the ECU 404 and configured to determine location data. The ECU 404 may use the location data along with map data stored in memory 410 to determine a location of the vehicle. In other embodiments, the location sensor 430 has access to the map data and may determine the location of the vehicle and provide the location of the vehicle to the ECU 404. The location sensor 430 may be a GPS unit, a GLONASS system device, a Galileo system device, or any other global location detection device. The location data may be used to determine location-based trends in the gathered sensor data.

The memory 410 is connected to the ECU 404 and may be connected to any other component of the vehicle. The memory 410 is configured to store any data described herein, such as the spatial data, image data, vibration data, engine sensor data, motor/generator sensor data, transmission sensor data, steering wheel sensor data, accelerator pedal data, brake pedal data, the data received from any other sensors, and any data received from the remote data server 412 via the transceiver 408.

The sensor data may be communicated from the vehicle 402 to the remote data server 412 via the transceiver 408 of the vehicle 402 and the transceiver 416 of the remote data server 412. The remote data server 412 includes a processor 414, a transceiver 416, and a memory 418, all connected to each other via a communications bus. The processor 414 (and any processors described herein) may be one or more computer processors configured to execute instructions stored on a non-transitory memory.

The memory 418 may be a non-transitory memory configured to store sensor data of the vehicle 402. The memory 418 may also be used to store driver rating data associated with each driver of the vehicles 402. The sensor data may be weighed based on the driver rating data of the respective driver of the vehicle 402. For example, if a first driver is a less skilled driver than an average driver, any sensor data associated with the first driver used for determining improvements in vehicle design may be lowered in weight, as a detected possible improvement may be more a possible improvement of driver skill than an improvement of vehicle design. In the same manner, if a second driver is a more skilled driver than an average driver, any sensor data associated with the second driver used for determining improvements in vehicle design may be increased in weight.

The memory 418 may also store data associated with the design and manufacture of the vehicle 402, including materials used and design specifications of the vehicle 402 (e.g., the first version vehicle design). The memory 418 may be a sorted collection of the sensor data received by the plurality of vehicles. The memory 418 may sort the data in any way that increases the processor's ability to efficiently access the data. The transceiver 416 may be configured to transmit and receive data, similar to transceiver 408.

The remote data server 412 may be communicatively coupled to a computing device 420 used for designing a subsequent version of the vehicle 402 (e.g., a second version vehicle design). The remote data server 412 may be directly connected to the computing device 420 via a data cable or may be connected to the computing device 420 via a network, such as a local area network or the Internet.

The computing device 420 includes a processor 422, a memory 432, a transceiver 426, and a display 428, which may all be connected to each other via a communications bus. The processor 422 may be one or more computer processors configured to execute instructions stored on a non-transitory memory. The memory 432 may be a non-transitory memory configured to store data. The transceiver 426 may be configured to transmit and receive data, similar to transceivers 408 and 416.

In some embodiments, the processor 414 of the remote data server 412 is configured to determine trends based on the sensor data and determine any possible improvements to the vehicle design based on the determined trends. In some embodiments, the processor 422 of the computing device 420 receives the sensor data stored in the memory 418 of the remote data server 412 and the processor 422 of the computing device 420 is configured to determine trends based on the sensor data and determine any possible improvements to the vehicle design based on the determined trends.

The processor 414 of the remote data server 412 and/or the processor 422 of the computing device 420 may use machine learning techniques to determine trends based on the sensor data and may also use machine learning techniques to determine any possible improvements. One or more algorithms for determining trends or outliers in the sensor data may also be used to determine any possible improvements.

The processor 422 is configured to render a graphical user interface (e.g., user interface 302) to facilitate designing of the subsequent version of the vehicle 402. As described herein, the user interface may be generated by computer software executed by the computing device 420 that is specially programmed and specially constructed to facilitate computer-aided vehicle design.

Once a possible improvement is determined by the processor 422 of the computing device 420 or the processor 414 of the remote data server 412, the display 428 (e.g., display screen 304) of the computing device 420 may automatically display an alert on the user interface to indicate that an improvement that may be made to the vehicle design based on the sensor data, as described herein.

In some embodiments, instead of alerting the vehicle designer to improvements which may be made via the display 428, the computing device 420 automatically determines changes to make to the vehicle to improve one or more aspects of the vehicle based on the sensor data, and the computing device 420 automatically designs the vehicle to incorporate the determined changes. The computing device 420 may be connected to a vehicle manufacturing device 450 configured to automatically construct a new vehicle based on the second version vehicle design.

While only two vehicles 402A-402B are shown, any number of vehicles may be used. Likewise, while only one remote data server 412 is shown, any number of remote data servers in communication with each other may be used. Multiple remote data servers may be used to increase the memory capacity of the data being stored across the remote data servers, or to increase the computing efficiency of the remote data servers by distributing the computing load across the multiple remote data servers. Multiple vehicles or sensors may be used to increase the robustness of sensor data. Multiple remote data servers may be interconnected using any type of network, or the Internet.

As used herein, a "unit" may refer to hardware components, such as one or more computer processors, controllers, or computing devices configured to execute instructions stored in a non-transitory memory.

Figure 5:
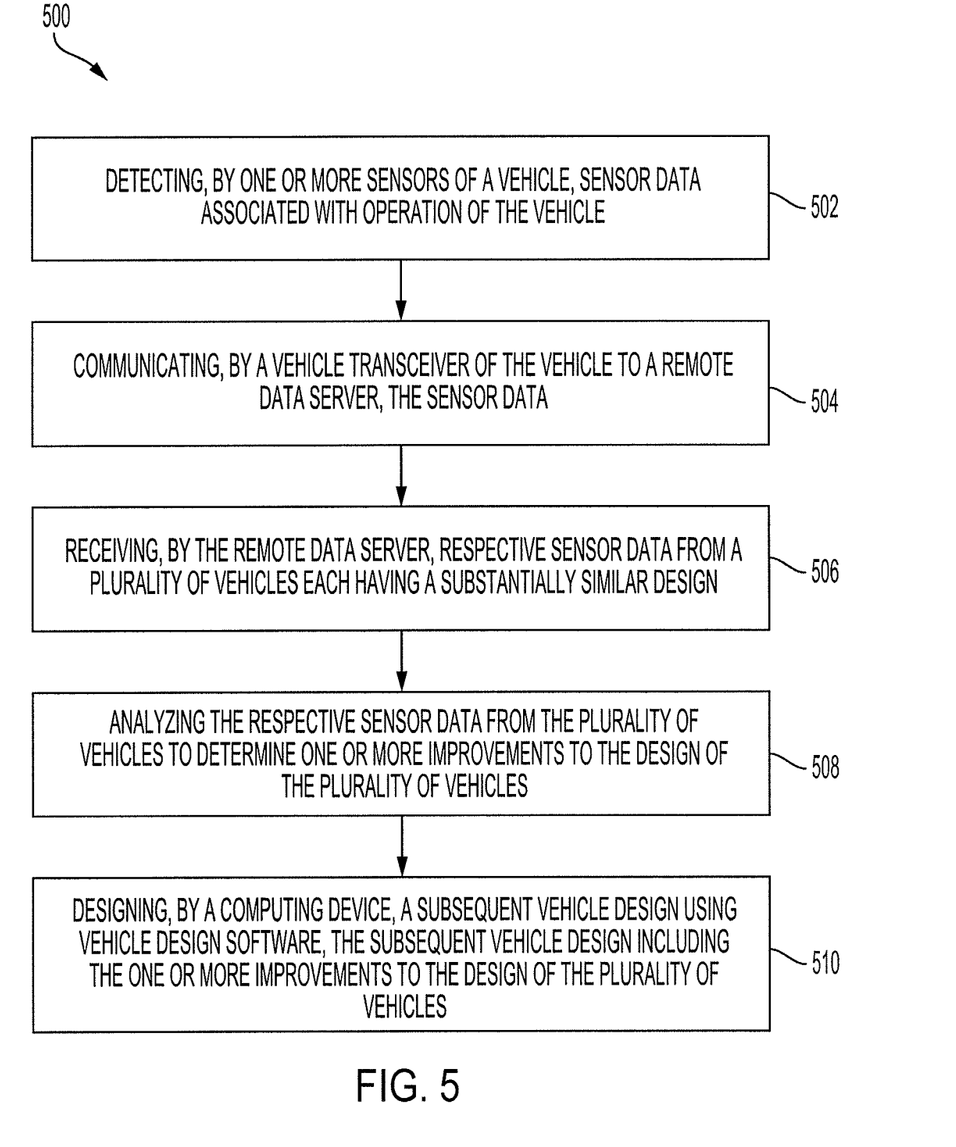
FIG. 5 illustrates a process of improving vehicle design, according to various embodiments of the invention.

FIG. 5 is a flow diagram of a process 500 for improving vehicle design using the systems and devices described herein.

One or more sensors of a vehicle detect sensor data (step 502). The vehicle may be one of many vehicles having a first version vehicle design. The one or more sensors may include a spatial sensor, an image sensor, or a vibration sensor configured to detect a collision and determine a location of the collision on the first version vehicle, as described herein. The one or more sensors may also include an engine sensor, a motor/generator sensor, a transmission sensor, a steering wheel sensor, one or more weight sensors, an accelerator pedal sensor, and/or a brake pedal sensor, which may be used to determine a vehicle maneuver associated with the detected collision. In some embodiments, the sensor data from the engine sensor, the motor/generator sensor, the transmission sensor, the steering wheel sensor, the one or more weight sensors, the accelerator pedal sensor, and/or the brake pedal sensor may be analyzed to determine improvements that may be made to the vehicle design, such as adjusting a weight distribution of the vehicle, adjusting steering wheel tightness, or adjusting materials the vehicle is made of.

As described herein, any or all of the sensors of the vehicle may be conventionally used for other purposes (e.g., parking assistance, driving assistance, lane assistance) but are used by the systems and methods described herein in an unconventional way.

A vehicle transceiver (e.g., transceiver 408) communicates the sensor data to a remote data server (e.g., remote data server 412) (step 504). The remote data server includes a transceiver (e.g., transceiver 416) for receiving the sensor data from the vehicle.

The remote data server receives sensor data from a plurality of vehicles (step 506). In some embodiments, all of the vehicles in the plurality of vehicles have a substantially similar design (e.g., a 2012 Make M, Model Q or a 5th generation Make M, Model Q). In some embodiments, the plurality of vehicles are of varying makes, models, and design versions, and the remote data server automatically organizes the sensor data based on the make, model, and design version of the vehicle the sensor data is received from, and stores the sensor data in memory (e.g., memory 418).

The sensor data from the plurality of vehicles of substantially the same design are analyzed to determine one or more improvements to the vehicle design (step 508). This step may be performed by the remote data server or may be performed by a computing device (e.g., computing device 420) connected to the remote data server. As described herein, various techniques and methods may be used to determine the one or more improvements to the vehicle design. However, all of the techniques require the use of a computer, such as computing device 420 or remote data server 412, to determine the one or more improvements to the vehicle design. Without the processing capabilities of a computer, the sensor data is not able to be analyzed to determine the one or more improvements in a timely manner, as design revisions occur at a relatively short frequency.

The computing device (e.g., computing device 420) designs a subsequent vehicle design using vehicle design software (step 510). The subsequent vehicle design includes the one or more improvements to the design of the plurality of vehicles. That is, the subsequent vehicle design is a second version vehicle design that incorporates the one or more improvements into the first version vehicle design.

In some embodiments, the computing device automatically incorporates the one or more improvements into the subsequent vehicle design. In some embodiments, the computing device automatically instructs a vehicle manufacturing device to manufacture a new vehicle according to the subsequent vehicle design.

In some embodiments, a display screen is connected to the computing device, and the computing device renders a user interface for display by the display screen. On the user interface, there may be an alert associated with the one or more improvements to the vehicle design such that a user of the vehicle design software executed by the computing device is made aware of the suggested improvements to the vehicle design.

Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A system for improving vehicle design, the system comprising:
    a plurality of first version vehicles, each first version vehicle of the plurality of first version vehicles having a first version vehicle design, and including one or more spatial sensors or image sensors configured to provide feedback to a driver while parking the first version vehicle and detect a collision and a location of the collision on the first version vehicle, and a vehicle transceiver configured to communicate the detected collision and the location of the collision on the first version vehicle;
    a remote data server configured to receive the detected collision and the location of the collision from the plurality of first version vehicles, and determine one or more improvements to the first version vehicle design by determining a frequency of detected collisions at the location of the collision on the first version vehicle across the plurality of first version vehicles; and
    a computing device coupled to the remote data server and configured to execute vehicle design software for designing a second version vehicle design, the second version vehicle design including the one or more improvements to the first version vehicle design.

2. The system of claim 1, further comprising a vibration sensor configured to detect the collision and determine the location of the collision on the first version vehicle.

3. The system of claim 2, further comprising one or more additional sensors including at least one of an engine sensor, a motor/generator sensor, a transmission sensor, a steering wheel sensor, one or more weight sensors, an accelerator pedal sensor, or a brake pedal sensor,
    wherein the remote data server is further configured to determine a vehicle maneuver associated with the detected collision based on sensor data from the at least one of the engine sensor, the motor/generator sensor, the transmission sensor, the steering wheel sensor, the one or more weight sensors, the accelerator pedal sensor, or the brake pedal sensor, and
    wherein the remote data server is configured to determine the one or more improvements to the first version vehicle design based on the determined vehicle maneuver associated with the detected collision.

4. The system of claim 1, wherein the computing device is configured to automatically incorporate the one or more improvements to the first version vehicle design into the second version vehicle design.

5. The system of claim 4, further comprising a vehicle manufacturing device connected to the computing device and configured to automatically manufacture a second version vehicle based on the second version vehicle design.

6. The system of claim 1, further comprising a display screen connected to the computing device,
    wherein the computing device is further configured to render a graphical user interface for interacting with a user, and
    wherein the graphical user interface includes an alert indicating to the user at least one of the one or more improvements to the first version vehicle design.

7. The system of claim 6, wherein the alert includes text associated with the one or more improvements to the first version vehicle design based on the detected collision and the location of the collision.

8. A system for improving vehicle design, the system comprising:
    a plurality of first version vehicles, each first version vehicle of the plurality of first version vehicles having a first version vehicle design, and including one or more spatial sensors or image sensors configured to provide feedback to a driver while parking the first version vehicle and detect a collision and a location of the collision on the first version vehicle, and a vehicle transceiver configured to communicate the detected collision and the location of the collision on the first version vehicle; and
    a computing device configured to receive the detected collision and the location of the collision, determine one or more improvements to the first version vehicle design by determining a frequency of detected collisions at the location of the collision on the first version vehicle across the plurality of first version vehicles, and execute vehicle design software for designing a second version vehicle design, the second version vehicle design including the one or more improvements to the first version vehicle design.

9. The system of claim 8, further comprising a remote data server configured to receive the detected collision and the location of the collision from the plurality of first version vehicles and communicate the detected collision and the location of the collision from the plurality of first version vehicles to the computing device.

10. The system of claim 8, further comprising a vibration sensor configured to detect the collision and determine the location of the collision on the first version vehicle.

11. The system of claim 10, further comprising one or more additional sensors including at least one of an engine sensor, a motor/generator sensor, a transmission sensor, a steering wheel sensor, one or more weight sensors, an accelerator pedal sensor, or a brake pedal sensor,
    wherein the computing device is further configured to determine a vehicle maneuver associated with the detected collision based on sensor data from the at least one of the engine sensor, the motor/generator sensor, the transmission sensor, the steering wheel sensor, the accelerator pedal sensor, or the brake pedal sensor, and
    wherein the computing device is configured to determine the one or more improvements to the first version vehicle design based on the determined vehicle maneuver associated with the detected collision.

12. The system of claim 8, wherein the computing device is configured to automatically incorporate the one or more improvements to the first version vehicle design into the second version vehicle design.

13. The system of claim 12, further comprising a vehicle manufacturing device connected to the computing device and configured to automatically manufacture a second version vehicle based on the second version vehicle design.

14. The system of claim 8, further comprising a display screen connected to the computing device,
wherein the computing device is further configured to render a graphical user interface for interacting with a user, and
wherein the graphical user interface includes an alert indicating to the user at least one of the one or more improvements to the first version vehicle design.

15. The system of claim 14, wherein the alert includes text associated with the one or more improvements to the first version vehicle design and a location of the respective one or more improvements to the first version vehicle design.

16. A method for improving vehicle design, the system comprising:
providing, by one or more spatial sensors or image sensors of a vehicle, feedback to a driver while parking the vehicle;
detecting, by the one or more spatial sensors or image sensors, a collision and a location of the collision on the vehicle;
communicating, by a vehicle transceiver of the vehicle to a remote data server, the detected collision and the location of the collision on the vehicle;
receiving, by the remote data server, respective detected collisions and locations of collisions from a plurality of vehicles each having a substantially similar design;
determining one or more improvements to the design of the plurality of vehicles by determining a frequency of detected collisions at the location of the collision on the vehicle across the plurality of vehicles; and
designing, by a computing device, a subsequent vehicle design using vehicle design software, the subsequent vehicle design including the one or more improvements to the design of the plurality of vehicles.

17. The method of claim 16, wherein the remote data server analyzes the respective detected collisions and locations of collisions from the plurality of vehicles to determine the one or more improvements to the design of the plurality of vehicles.

18. The method of claim 16, wherein the computing device analyzes the respective detected collisions and locations of collisions from the plurality of vehicles to determine the one or more improvements to the design of the plurality of vehicles.

19. The method of claim 16, further comprising automatically manufacturing, by a vehicle manufacturing device connected to the computing device, a subsequent version vehicle based on the second version vehicle design.

20. The method of claim 16, further comprising:
rendering, by the computing device, a graphical user interface for interacting with a user, the graphical user interface including an alert indicating to the user at least one of the one or more improvements; and
displaying, by a display screen connected to the computing device, the graphical user interface.

* * * * *